United States Patent [19]
Latzel et al.

[11] Patent Number: 6,049,226
[45] Date of Patent: Apr. 11, 2000

[54] LEVEL CONVERTER

[75] Inventors: Thomas Latzel, München; Christian Sporrer, Groebenzell, both of Germany

[73] Assignee: Siemens Aktiengesellschaft, Munich, Germany

[21] Appl. No.: 09/121,508

[22] Filed: Jul. 23, 1998

[30] Foreign Application Priority Data

Jul. 23, 1997 [DE] Germany ............... 197 31 704

[51] Int. Cl.[7] ............... H03K 19/0175; H03K 19/094
[52] U.S. Cl. ............................. 326/68; 326/68
[58] Field of Search ........................... 326/68, 73, 74, 326/80, 81, 83, 86, 121

[56] References Cited

U.S. PATENT DOCUMENTS 5,317,213  5/1994  Sato et al. .
5,396,128  3/1995  Dunning et al. ............... 326/68

FOREIGN PATENT DOCUMENTS 0 410 885 A2  1/1991  European Pat. Off. .

*Primary Examiner*—Michael Tokar
*Assistant Examiner*—Thanh-Tam Le
*Attorney, Agent, or Firm*—Herbert L. Lerner; Laurence A. Greenberg; Werner H. Stemer

[57] ABSTRACT

A level converter for converting two input levels into two output levels includes two push-pull paths having inputs forming a level converter input and outputs coupled crosswise and forming two level converter outputs. The level converter can be produced by using integrated circuit technology. The circuit operates without current in a quiescent state and recharging currents flow only during switching processes.

8 Claims, 1 Drawing Sheet

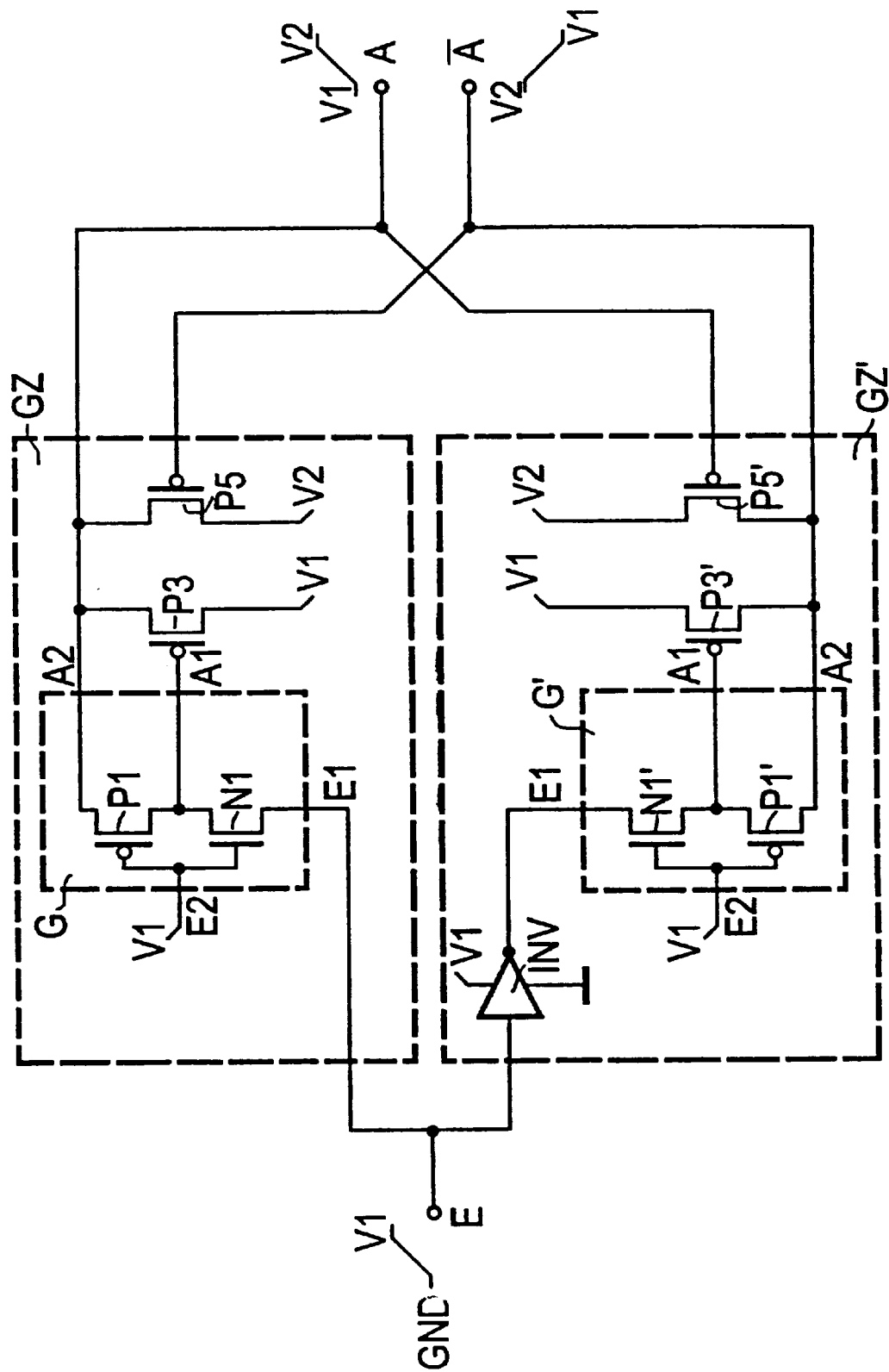

LEVEL CONVERTER

BACKGROUND OF THE INVENTION

Field of the Invention

The invention relates to a level converter for converting two input potentials into two output potentials. It should be possible to produce the circuit by using integrated circuit technology.

In a conventional level converter circuit, the level is converted by using reference diodes. A disadvantage of that circuit, which uses the diodes to produce a reference voltage, is the constant current consumption. The reference voltage is strongly dependent on temperature and technology. Conventionally, transistors are used which operate as diodes. That means that the reference voltage is dependent on the threshold voltage of the transistors, and therefore on the technology.

SUMMARY OF THE INVENTION

It is accordingly an object of the invention to provide a level converter, which overcomes the hereinafore-mentioned disadvantages of the heretofore-known devices of this general type, i.e. the circuit is not dependent on technology and can thus be produced by using integrated circuit technology. In addition, the level converter should operate without current. With the foregoing and other objects in view there is provided, in accordance with the invention, a level converter, comprising a level converter input, a level converter output, an inverted level converter output, a first push-pull input stage as well as a first and a second transistor. The first input of the first push-pull input stage is connected to the level converter input, and the first output of the first push-pull input stage is connected to the control input of the first transistor. The second output of the first push-pull input stage is connected to the level converter output, the first output of the first transistor and the first output of the second transistor. The second input of the first push-pull input stage and the second output of the first transistor are connected to a first potential, while the second output of the second transistor is connected to a second potential. The control input of the second transistor is connected to the inverted level converter output. The circuit elements connected as above form a constituent part of a first circuit path in the level converter. In the following text, this circuit path is also referred to as the first push-pull path. A second circuit path (or second push-pull path) in the level converter has an inverter, a second push-pull input stage and a third and a fourth transistor. The first input of the second push-pull input stage is connected to the level converter input through the inverter, and the first output of the second push-pull input stage is connected to the control input of the third transistor. The second output of the second push-pull input stage is connected to the inverted level converter output, the first output of the third transistor and the first output of the fourth transistor. The second input of the second push-pull input stage and the second output of the third transistor are connected to the first potential, and the output of the fourth transistor is connected to the second potential. Finally, the control input of the fourth transistor is connected to the level converter output which is not inverted.

In accordance with another feature of the invention, the first push-pull input stage has two transistors with outputs connected in series and control inputs connected to one another to form the second input of the first push-pull input stage. The two transistor outputs of the first push-pull input stage, which are connected to one another, form the first output of the first push-pull input stage. A further output of the transistors forms the second output of the first push-pull input stage. Another output of the transistors forms the first input of the push-pull input stage.

In accordance with a further feature of the invention, the two transistors in the push-pull input stage are field-effect transistors. The first transistor is an n-channel transistor and the second transistor is a p-channel transistor.

The second push-pull input stage is constructed in the same way as the first.

In accordance with a concomitant feature of the invention, the inverter is dimensioned asymmetrically in order to ensure that the push-pull input stages are driven symmetrically.

Other features which are considered as characteristic for the invention are set forth in the appended claims.

Although the invention is illustrated and described herein as embodied in a level converter, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

BRIEF DESCRIPTION OF THE DRAWING

The FIGURE of the drawing is a schematic circuit diagram showing the structure of the inventive level converter.

DESCRIPTION OF THE PREFERRED EMBODIMENTS

Referring now in detail to the single figure of the drawing, there is seen a level converter with an input E having either a level GND or a first level V1 applied thereto. The input E is connected to a first input E1 of a first push-pull input stage G. A first output A1 of the first push-pull input stage G is connected to a control input of a first transistor P3. A second output A2 of the first push-pull input stage G is connected to a first output of the transistor P3, a first output of a second transistor P5 and a level converter output A. A second output of the transistor P3 and a second input E2 of the first push-pull input stage G are connected to the first level V1. A second output of the transistor P5 is connected to a second level V2. A control input of the transistor P5 is connected to an inverted level converter output $\overline{A}$. The above-mentioned circuit elements form a first circuit path (which is also referred to as a first push-pull path GZ) in the level converter.

An output of a second circuit path (or second push-pull path GZ') in the level converter is coupled crosswise to the first circuit path. The second circuit path additionally has an inverter INV at its input. An input of this inverter is connected to the level converter input E. An output of the inverter INV is connected to a first input E1 of a second push-pull input stage G'. A first output A1 of the second push-pull input stage G' is connected to a control input of a third transistor P3'. A second output A2 of the second push-pull input stage G' is connected to a first output of the transistor P3', a first output of a fifth transistor P5' and the inverted level converter output $\overline{A}$. A second output of the transistor P3', a second input E2 of the second push-pull input stage G' and a voltage supply of the inverter INV, are all connected to the first level V1. A second output of the transistor P5' is at the level V2. A control input of the transistor P5' is connected to the level converter output A.

Both the first and the second push-pull input stages G, G' have two transistors P1, N1 and P1', N1' having outputs which are connected in series and control inputs that are connected to one another and form the second input E2 of the respective push-pull input stage G or G'. The two mutually connected outputs of the transistors P1, N1 and P1', N1' and a further output of the transistors P1, and P1' respectively form the two outputs A1, A2 of the push-pull input stages G, G'. The output connections of the transistors N1 and N1' respectively form the first input E1 of the push-pull input stages G, G'. The transistors N1 and N1' are constructed as n-channel field-effect transistors, whereas the transistors P1, P1', P3, P3', P5 and P5' are p-channel field-effect transistors.

The inverter INV is dimensioned asymmetrically in order to ensure that the push-pull input stages G, G' are driven symmetrically. An output signal which is the inverse of the level converter output A can be picked off at the level converter output $\overline{A}$.

The level converter according to the invention is dimensioned in such a way that switching currents flow only during switching processes, but not in the quiescent state. The circuit is not dependent on technology and has a purely digital structure.

The inverter INV is used to invert the input levels GND and V1 applied to the level converter input E into V1 and GND, respectively. When the level GND is applied to the level converter input E, the gate of the transistor N1 allows a flow of current, i.e. the transistor N1 is on or is active. The gate of the transistor P1 is also at V1. As a result of feedback through the transistor P3, which is also turned on, the transistor P1 is turned off. At the same time, the transistor P5 is turned off by the output signal from the second circuit path (or second push-pull path GZ'). The level converter output A produces the potential V1 and V2, respectively.

If the level V1 is produced at the level converter input E, the transistor N1 is off (inactive). The gate of the transistor P1 is at the level V1, just like that of the transistor N1. The output signal produced by the first circuit path (first push-pull path GZ) turns the transistor P5 on (active, conducting), in so doing turns the transistor P1 on, and consequently, in turn, turns the transistor P3 off. The level converter output A then produces the level V2 and V1, respectively.

All gate-source, gate-drain and drain-source voltages are lower than or the same as the level V1.

We claim:

1. A level converter, comprising:

a level converter input, a level converter output and an inverted level converter output;

a first push-pull input stage having first and second inputs and first and second outputs;

first and second transistors each having first and second outputs and a control input;

said first input of said first push-pull input stage connected to said level converter input, and said first output of said first push-pull input stage connected to the control input of said first transistor;

said second output of said first push-pull input stage connected to the first output of said first transistor, to the first output of said second transistor and to said level converter output;

an inverter;

a second push-pull input stage having first and second inputs and first and second outputs;

third and fourth transistors each having first and second outputs and a control input;

said first input of said second push-pull input stage connected through said inverter to said level converter input, and said first output of said second push-pull input stage connected to the control input of said third transistor;

said second output of said second push-pull input stage connected to the first output of said third transistor, to the first output of said fourth transistor and to said inverted level converter output;

said second inputs of said first and second push-pull input stages and the second outputs of said first and third transistors connected to a first potential;

the second outputs of said second and fourth transistors connected to a second potential; and the control input of said second transistor connected to said inverted level converter output, and the control input of said fourth transistor connected to said level converter output.

2. The level converter according to claim 1, wherein:

each of said push-pull input stages includes two transistors each having outputs and a control input;

the control inputs of said two transistors are connected to one another and to said second input of said push-pull input stage;

one of the outputs of each of said two transistors are connected in series and form said first output of said push-pull input stage;

another output of one of said two transistors forms said second output of said push-pull input stage; and a further output of one of said two transistors forms said first input of said push-pull input stage.

3. The level converter according to claim 1, wherein said transistors are field-effect transistors.

4. The level converter according to claim 2, wherein said transistors are field-effect transistors.

5. The level converter according to claim 2, wherein one of said two transistors of each of said push-pull input stages is a p-channel transistor, and the other of said two transistors of each of said push-pull input stages is an n-channel transistor.

6. The level converter according to claim 1, wherein said first, second, third and fourth transistors are p-channel transistors.

7. The level converter according to claim 1, wherein said inverter is dimensioned asymmetrically for driving said push-pull input stages symmetrically.

8. The level converter according to claim 2, wherein said transistors have gate-source, gate-drain and drain-source voltages at least as low as the first potential.

* * * * *